(12) United States Patent
Lahnor

(10) Patent No.: US 6,689,691 B2
(45) Date of Patent: Feb. 10, 2004

(54) METHOD OF SIMULTANEOUSLY POLISHING A PLURALITY OF OBJECTS OF A SIMILAR TYPE, IN PARTICULAR SILICON WAFERS, ON A POLISHING INSTALLATION

(75) Inventor: Peter Lahnor, Dresden (DE)

(73) Assignee: Infineon Technologies AG, Munich (DE)

( * ) Notice: Subject to any disclaimer, the term of this patent is extended or adjusted under 35 U.S.C. 154(b) by 74 days.

(21) Appl. No.: 10/117,826

(22) Filed: Apr. 8, 2002

(65) Prior Publication Data
US 2002/0146877 A1 Oct. 10, 2002

(30) Foreign Application Priority Data
Apr. 7, 2001 (DE) .......................... 101 17 612

(51) Int. Cl.[7] ..................... H01L 21/302; H01L 21/461; C23F 1/02; B24B 47/02
(52) U.S. Cl. ................. 438/690; 438/691; 438/692; 156/345.22; 451/332
(58) Field of Search ................. 438/690, 691, 438/692, 693; 451/385, 397–402, 332; 156/345.22

(56) References Cited

U.S. PATENT DOCUMENTS 6,051,499 A * 4/2000 Tolles et al. .................. 216/89
6,062,954 A * 5/2000 Izumi .......................... 451/285
6,218,306 B1 * 4/2001 Fishkin et al. ............... 438/692
6,478,977 B1 * 11/2002 Moriyama et al. ............ 216/52
2002/0192966 A1 * 12/2002 Shanmugasundram et al. .. 438/692
2003/0013306 A1 * 1/2003 Tsai et al. .................... 438/692
2003/0022497 A1 * 1/2003 Li et al. ...................... 438/690
2003/0022501 A1 * 1/2003 Tsai et al. .................... 438/692

FOREIGN PATENT DOCUMENTS

| DE | 199 07 956 A1 | 10/1999 | |
| EP | 0 928 662 A2 | 7/1999 | ........... B24B/37/04 |
| EP | 1 063 055 A2 | 12/2000 | ........... B24B/37/04 |

* cited by examiner

*Primary Examiner*—Erik Kielin
(74) *Attorney, Agent, or Firm*—Laurence A. Greenberg; Werner H. Stemer; Ralph E. Locher

(57) ABSTRACT

The method allows simultaneous polishing of a plurality of objects of a similar type, preferably silicon wafers. The polishing process is interrupted briefly at least once. During the polishing pause, the carriers on which the objects to be polished have been mounted are rotated onward sequentially and then the polishing operation is continued. The objects are mounted on one or more carriers which are at a free position during the polishing operation. This has the advantage that the polishing operation does not have to be additionally interrupted for the purpose of loading and unloading the carrier. This saves valuable machine time, so that the throughput is increased. At the same time, the fact that each wafer is processed at a plurality of polishing plates stabilizes the result of polishing, since the individual abrasion properties of the individual polishing plates are averaged out.

3 Claims, 3 Drawing Sheets

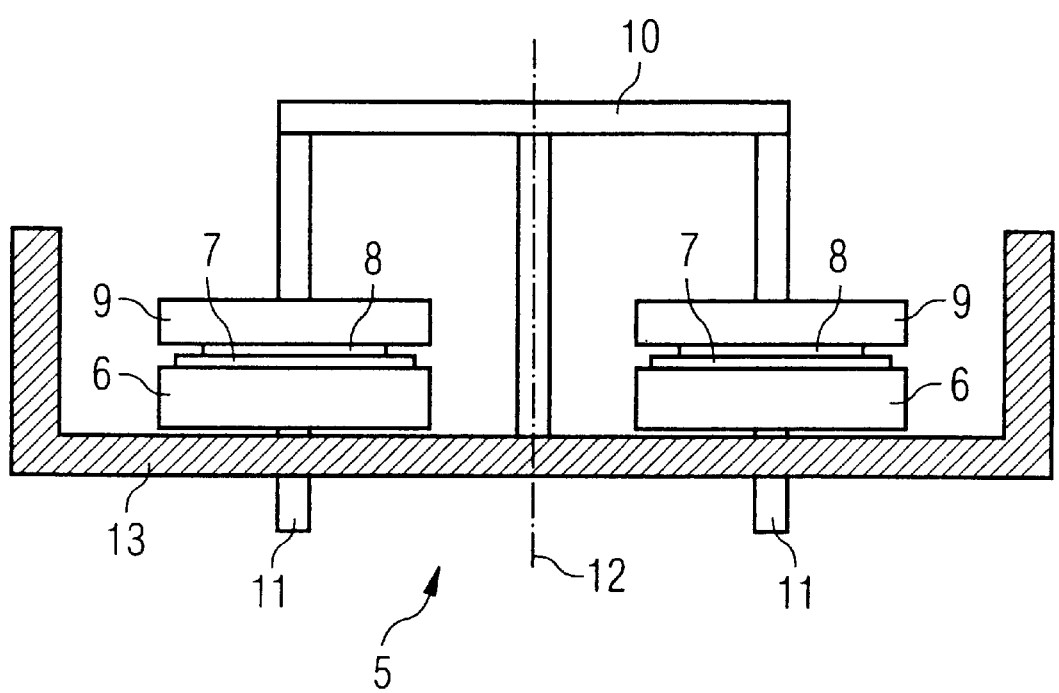

METHOD OF SIMULTANEOUSLY POLISHING A PLURALITY OF OBJECTS OF A SIMILAR TYPE, IN PARTICULAR SILICON WAFERS, ON A POLISHING INSTALLATION

BACKGROUND OF THE INVENTION

Field of the Invention

The invention pertains to a method in which a plurality of objects of a similar type are simultaneously polished on a polishing installation provided with two polishing plates that are actively operated in parallel. The invention also pertains to a corresponding polishing installation. It is already known that a very wide range of types of objects are mechanically polished to obtain a high-quality, planar surface. Suitable polishing installations (CMP, chemical mechanical polishing installations) are commercially available for these applications. These installations are in use, for example, in various sectors of the semiconductor fabrication industry.

By way of example, semiconductor wafers, in particular silicon wafers, have to be polished as gently as possible after they have been patterned with the corresponding circuit parts. In the semiconductor industry, it is preferred to use polishing installations with two or more polishing plates, on which the silicon wafers are processed simultaneously, to polish these silicon wafers. In this process, first of all the individual silicon wafers are positioned with the surface to be polished on the polishing plates by means of suitable carriers. The polishing process then begins, with all the silicon wafers being polished simultaneously until the desired result is achieved. Then, unpolished silicon wafers have to be fitted to all the polishing plates again, so that a new polishing operation can be started.

In practice, it has been found that FA polishing cloths (fixed abrasive polishing cloths) are particularly suitable for this polishing operation. An abrasive which is used to process the surface of the silicon wafers is embedded in these polishing cloths. However, this method using FA polishing cloths has the drawback that the state of the polishing cloth and therefore the result of polishing are determined to a considerable extent by the structure of the surface of the silicon wafer which is to be polished. For example, if partially polished, patterned silicon wafers were to be transferred to a different polishing plate, the non-uniform topology or different degree of wear of the FA polishing cloths could lead to an unsatisfactory result of polishing. For this reason, the operation of polishing a silicon wafer is always carried out entirely on the same polishing plate. The additional mounting time required for loading and unloading is grudgingly accepted.

As an alternative to polishing plates with adhesively bonded polishing cloths, it is also possible to use plate structures in which the polishing cloth is in the form of a strip and is tensioned between two rollers, of which one roller holds the unused polishing cloth and of which the used cloth is wound onto the other roller. In this case, the polishing-cloth strip is typically wound a certain distance from one roller onto the other between two polishing processes, so that each silicon wafer is in contact with the same proportion of used and unused polishing cloth during the polishing process.

SUMMARY OF THE INVENTION

It is accordingly an object of the invention to provide a method of simultaneously polishing a plurality of similar-type objects on a polishing installation with a plurality of polishing plates, which overcomes the above-mentioned disadvantages of the heretofore-known devices and methods of this general type and which is optimized so that the objects are polished with the plurality of polishing plates operated actively in parallel with one another.

With the foregoing and other objects in view there is provided, in accordance with the invention, a method for simultaneously polishing a plurality of objects of a similar type in a polishing installation with at least two polishing plates disposed diagonally opposite one another with respect to a central axis, and at least four carriers for holding the objects to be polished. A rotary cross connects the four carriers to one another, the rotary cross is rotatably mounted about the central axis and disposed substantially coaxially with respect to the at least two polishing plates, such that in each position of the polishing installation, in each case one carrier comes to lie opposite a polishing plate and at least one further carrier is located in a loading and unloading position for the object. The following steps are included in the novel method:

dividing each polishing operation into at least first and second polishing sections;

rotating the two carriers opposite the two polishing plates, together with the objects to be polished, through 180° between the first and second polishing sections; and during an ongoing polishing operation, exchanging the object at the carrier located in the loading and unloading position of the polishing installation in each polishing section.

In accordance with an added feature of the invention, each polishing section is defined to correspond to approximately half a polishing time.

In a preferred embodiment, after a polishing operation has ended, one of the two carriers located opposite the two polishing plates is rotated, together with the polished objects, into the loading and unloading position for the object.

With the above and other objects in view there is also provided, in accordance with the invention, a polishing installation, comprising:

at least two polishing plates disposed diagonally opposite one another with respect to a central axis;

at least four carriers for holding objects to be polished, and a rotary cross connecting the four carriers to one another;

the rotary cross being rotatably mounted about the central axis, and being disposed coaxially with respect to the at least two polishing plates;

wherein, in each position of the polishing installation, in each case one of the carriers lies opposite one polishing plate, and at least one further the carrier is located in a loading and unloading position for the object;

wherein at least first and second polishing-installation positions are defined for each polishing operation, and the two carriers lying opposite the two polishing plates, together with the objects to be polished, are rotated through 180° between the first and second polishing-installation positions; and wherein it is possible, during an ongoing polishing operation, to exchange an object on the carrier located in the loading and unloading position in each of the polishing-installation positions.

The invention is suitable in particular for all polishing processes in which the state of the polishing cloth and therefore the result of polishing are influenced by the structure of the polished silicon wafers.

The method according to the invention for simultaneously polishing a plurality of objects of a similar type on a polishing installation having two polishing plates which are actively operated in parallel, and the corresponding polishing installation according to the invention, have the advantage that no or only a little additional machine running time is required for loading and unloading of the objects, so that in practice the polishing operation can be carried out in the shortest possible time. In this context, the fact that the ongoing polishing operation is only interrupted briefly for rotation of the rotary cross, so that on the one hand a "new" carrier is moved into position for changing the wafer and, secondly, it is possible to compensate for different polishing properties of the polishing plates, is considered particularly advantageous. The result of polishing is improved and the process becomes more stable.

Since, in the proposed polishing method according to the invention, there is always one carrier at a free position, during the ongoing polishing process it is advantageously possible for the object to be loaded and unloaded, so that the polishing operation can be shortened considerably.

A further advantage is that despite the interruptions the polishing process can be continued with an FA polishing cloth, since all the exchanged objects and the associated FA polishing cloths are in the same state. It is therefore possible to successfully reduce differences in the results of polishing.

To achieve the maximum possible throughput of polished objects, it appears favorable for the duration of a polishing phase to be determined as a function of the time which is required for the loading and unloading of the free carrier.

It is also favorable for the number of interruptions in the ongoing polishing process to be determined as a function of the number of actively operated polishing plates. For example, if only a few polishing plates are required, the number of interruptions required to the ongoing polishing operation is also reduced. This likewise leads to a quicker throughput.

Furthermore, it is advantageous for this method to be applied even if not all the available polishing plates of a polishing installation are operated with the same polishing method. The best polishing results are achieved if, for example in the case of a polishing installation with three polishing plates, only two polishing plates are operated actively, these two polishing plates being arranged diagonally opposite one another. In this case, only one interruption is required in order to achieve an optimum throughput. The inactive polishing plate could then remain unused. This arrangement has the advantageous result that, when changing the two processed silicon wafers after an interruption, the two associated FA polishing cloths also have the same abrasion properties.

It is also considered favorable for an unused polishing plate to be available for a further application in a polishing process. This results in the advantage that this polishing plate can be used, for example, for a conventional polishing operation, for example for preliminary cleaning or for finishing polishing, without the polishing process on the other polishing plates being impeded.

A favorable alternative solution is also regarded as lying in an arrangement in which a plurality of free carriers are fitted with unpolished objects. This could be carried out using a suitable mechanical device. This further accelerates the loading and unloading operation.

A preferred application of the polishing method according to the invention is considered to lie in the arrangement in which silicon wafers are used as the objects. These silicon wafers can be processed at low cost using the FA polishing process in particular after they have been patterned.

Other features which are considered as characteristic for the invention are set forth in the appended claims.

Although the invention is illustrated and described herein as embodied in a method for simultaneously polishing a plurality of objects of a similar type, in particular silicon wafers, on a polishing installation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a sectional illustration through a polishing installation;

DESCRIPTION OF THE PREFERRED EMBODIMENTS

Figure 2A:
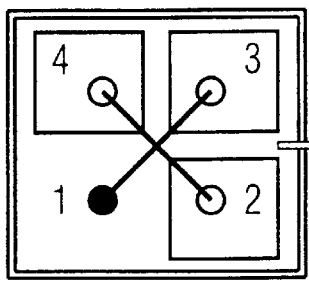
FIGS. 2A to 2G are diagrammatic views of a sequence involved in the polishing operation of a prior art polishing process; and, FIGS. 3A to 3G are diagrammatic views of the sequence in the polishing operation according to an exemplary embodiment of the invention.

Referring now to the figures of the drawing in detail and first, particularly, to FIG. 1 thereof, there is shown a diagrammatic cross section through a commercially available polishing installation 5 as used as a CMP installation in semiconductor fabrication. In principle, any desired objects can be processed on a polishing installation 5 of this type. However, for reasons of simplicity, the following description will be based on the example of silicon wafers 8.

The polishing installation 5 has a table 13 on which one or more polishing plates 6 (platens 6) are arranged. By way of example, two polishing plates 6 are illustrated in FIG. 1. The polishing plates 6 are driven via a drive shaft 11, preferably by an electric motor, to rotate about a rotary drive axis defined by the respective shaft 11. An FA polishing cloth 7, in which an abrasive or abrasive material is incorporated, is tensioned over the polishing plates 6 for the intended polishing method. The object 8 which is to be polished, in a preferred exemplary embodiment a silicon wafer, is placed onto the surface of the FA polishing cloth 7 by way of a carrier 9 (polishing head), such that the surface of the object that is to be processed presses onto the FA polishing cloth 7.

The carrier 9 substantially comprises a gripper arm which holds the silicon wafer 8 by means of a vacuum. By way of example, three polishing plates 6 and four carriers 9 are arranged in the polishing installation 5. The carriers 9 which are present are connected to one another via a rotary cross 10, so that all the polishing plates 6 which are present can be occupied by one silicon wafer 8 through a rotary movement of the rotary cross 10. The carriers 9 likewise rotate, so that a silicon wafer 8 can be moved in a rotary movement or in an oscillating fashion with respect to the rotary movement of the polishing plate 6. To achieve the most uniform possible removal of material by polishing, the carriers 9 with the silicon wafers 8 are arranged eccentrically relative to the polishing plates 6.

The loading and unloading of the carrier 9 preferably take place at a location of the table 13 at which there is no polishing plate 6. By way of example, in a polishing installation 5 three polishing plates 6 are arranged in the shape of a ring around a central axis 12, each polishing plate 6 being offset by an angle of 90° about the center axis. This results in one free position, at which a changeover operation for loading and unloading the silicon wafers 8 can be carried out, since one of the four above-mentioned carriers 9 is positioned at this location. At this free position, a fully polished silicon wafer 8 can be removed and an unpolished silicon wafer 8 can be inserted.

There are also other commercially available polishing machines 5 in which the polishing plates 6 and the carriers 9 are arranged differently. The polishing method according to the invention is then adapted accordingly.

The sequence of the polishing process is explained in more detail with reference to FIGS. 2 and 3. FIGS. 2A to 2G show the individual steps involved in a prior art polishing method. There, the silicon wafers 8 located on the three polishing plates 6 are polished simultaneously until completion.

FIG. 2A shows a configuration with three polishing plates 6, the polishing plates 6 which are indicated as squares carrying out the polishing step according to the invention. The rotary cross 10 with the four carriers 9 is arranged concentrically with respect to the polishing plates 6, with the carrier 9 initially being at position 1 (bottom left in FIG. 2A). This position 1 is used as the loading and unloading position. The carriers 9 with the silicon wafers 8 are shown in the form of circles, the silicon wafers 8 which are to be processed being located at the carriers 9 indicated by the light circles. The dark circle in position 1 indicates that an unpolished silicon wafer 8 has already been loaded at this position. Identically marked circles indicate that these silicon wafers 8 are in the same processing state. The double-walled box surrounding FIG. 2A indicates that the polishing operation is ongoing in this process step.

For the sake of improved understanding, it is assumed that in the prior art polishing method, first of all the three silicon wafers 8 in positions 2, 3 and 4 have been polished to completion.

Figure 2B:
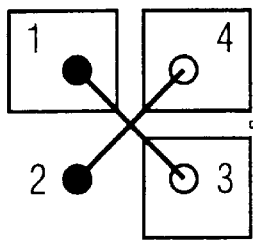

In a next step, as illustrated in FIG. 2B, the fully polished silicon wafers 8 are then successively moved into the lower left position in FIG. 2B by indexing the rotary cross 10 in the clockwise direction, so that the fully polished silicon wafers 8 can be removed. At the same time, unpolished silicon wafers 8 are inserted into the carrier 9. In FIG. 2B first of all the silicon wafer 8 at position 2 is removed. The continued rotation of the rotary cross 10 means that there is already one unpolished silicon wafer 8 resting on the top left polishing plate 6, while the polished silicon wafers 8 are still located at the two right-hand polishing plates 6 in positions 3 and 4.

Figure 2C:
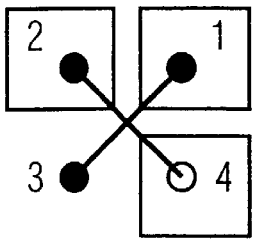

In the next step, as shown in FIG. 2C, the silicon wafer 8 at position 3 is exchanged as a result of the rotary cross 10 being indexed onward in the clockwise direction. There are now unpolished silicon wafers 8 on the two upper polishing plates 6, at positions 1 and 2.

Figure 2F:
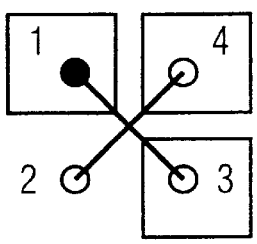
Figure 2E:
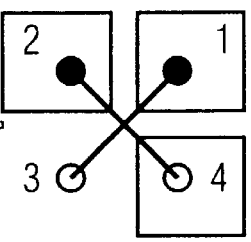
Figure 2D:
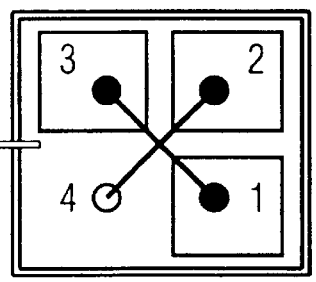

In FIG. 2D, the rotary cross 10 is rotated onward, so that the last polished silicon wafer 8, at position 4, can also be removed and a new, unpolished silicon wafer 8 inserted.

This exchange of the silicon wafers 8 takes up a relatively large amount of time in which the polishing installation cannot operate. A new polishing operation only commences in FIG. 2D (as indicated by the double-walled box) when the three carriers 9 which have been loaded with unpolished silicon wafers are above the three polishing plates 6. The reloading of the carrier 9 at position 4 takes place during the polishing.

Figure 2G:
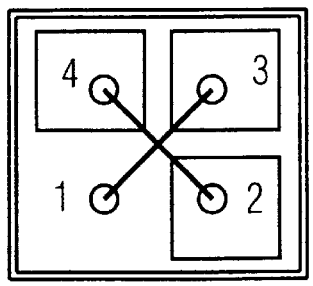

This process is continued in FIGS. 2E to 2G, since so far only the polished silicon wafers 8 in positions 1, 2 and 3 have been processed. Now, in FIG. 2E, the rotary cross 10 is rotated one position back, in the counter-clockwise direction, so that the silicon wafer 8 at position 4 (bottom right in FIG. 2E) is positioned on the polishing plate 6 and position 3 can be exchanged. In FIG. 2F, the rotary cross is rotated onward and position 2 is exchanged, until finally, in FIG. 2G, the unpolished silicon wafers 8 at positions 2, 3 and 4 are processed. The cycle is then ended and starts again, as illustrated in FIG. 2A.

It can be seen from the stipulated sequence that there is a total of six different combinations of polishing plates 6 with carriers 9. This large number of different polishing plate/carrier combinations is disadvantageous and therefore undesirable, since different abrasion characteristics may also result in different polishing results.

This drawback does not arise with the polishing method according to the invention, as will become clear from the following description. In the novel case, there are only four polishing plate/carrier combinations. This advantageously stabilizes and improves the result of polishing in particular in the CMP process in which FA polishing cloths are used.

Figure 3A:
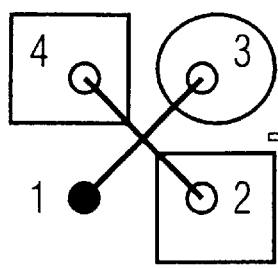
Figure 3B:
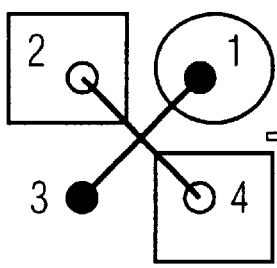

In this polishing method, the above-mentioned polishing installation 5 with three polishing plates 6 and four carriers 9 is used once again, but in this case only the polishing plates 6 which lie diagonally opposite one another, in the top left and bottom right in FIG. 3A, are used. The polishing plate 6 in the top right in FIG. 3A, which is marked by a large circle, is not used for polishing. It can be used, for example, for preliminary cleaning or for finishing polishing. The decisive factor is that the two active polishing plates 6 with the areas shown as squares operate alternately, the rotary cross 10 then being rotated through 180° in each instance.

With this polishing method, first of all the two silicon wafers 8 at positions 2 and 4 are polished, the polishing method being interrupted briefly after half the intended polishing duration. There is an unpolished wafer at position 1. During this interruption, the rotary cross 10 is rotated through 180°, so that, as can be seen from FIG. 3B, the two silicon wafers 8 at positions 2 and 4 have been swapped over. Prior to this, the two silicon wafers 8 at positions 2 and 4 have been processed uniformly for the duration of half the intended polishing duration, so that both the surfaces of these wafers and the states of the FA polishing cloths are similar. The continuation of the polishing operation with the polishing plates 6 having been swapped over does not result in any difference in quality, since in the second polishing phase too the polishing cloths 7 continue to operate with the same level of abrasion. During the second polishing phase, the silicon wafer 8 at position 3 is exchanged, so that there are now unpolished silicon wafers 8 inserted at the two carriers 9 at positions 1 and 3.

Figure 3C:
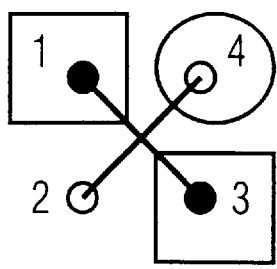

In FIG. 3C, the rotary cross 10 is rotated counter-clockwise through 90° so that the two newly inserted silicon wafers 8 at positions 1 and 3 are now being processed for the first partial phase of the polishing process. During this time, the silicon wafer 8 at position 2 is exchanged.

Figure 3F:
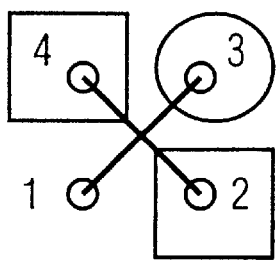
Figure 3E:
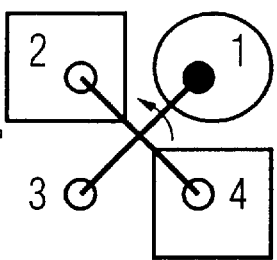
Figure 3D:
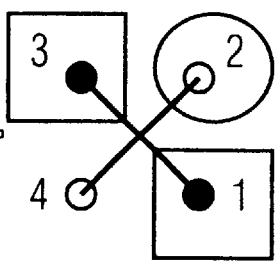

In FIG. 3D, the first part of the polishing process has ended, and the rotary cross 10 is rotated through 180°, so that the two silicon wafers 8 at positions 1 and 3 are swapped over.

The second part of the polishing process is now started, and the silicon wafer 8 in position 4 is exchanged.

After the second part of the polishing process has ended, in FIG. 3E the rotary cross 10 is once again rotated counterclockwise through 90°, so that the newly fitted silicon wafers 8 at positions 2 and 4 now lie at the polishing plates 6. The first part of the polishing process is started, and the silicon wafer 8 at position 3 can be exchanged.

In FIG. 3F, the process is once again interrupted briefly, so that the rotary cross 10 can be rotated through 180°. The second part of the polishing process is then started, and the silicon wafer 8 in position 1 is exchanged.

Figure 3G:
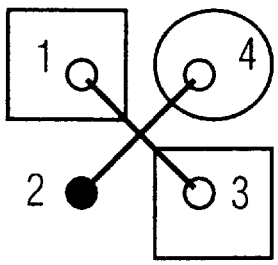

Finally, FIG. 3G shows the situation in which the rotary cross has been rotated 90° in the clockwise direction, so that the silicon wafer 8 at position 2 can also be exchanged.

This sequence of operations in the polishing process is then continued in the manner which has been described above.

Although in each case only two polishing plates 6 are being used simultaneously, the throughput of polished silicon wafers 8 using the method according to the invention is higher than with the known polishing method. This is because the relatively long times required to load and unload a carrier 9 do not delay the polishing process, since the loading and unloading is carried out in parallel with the polishing process.

I claim:

1. A method for simultaneously polishing a plurality of objects of a similar type, which comprises:

providing a polishing installation with at least two polishing plates disposed diagonally opposite one another with respect to a central axis, and at least four carriers for holding the objects to be polished, a rotary cross connecting the four carriers to one another, the rotary cross being rotatably mounted about the central axis and disposed substantially coaxially with respect to the at least two polishing plates, such that in each position of the polishing installation, in each case one carrier lies opposite a polishing plate and at least one further carrier is located in a loading and unloading position for the object;

dividing each polishing operation into no more than first and second polishing sections;

rotating the two carriers opposite the two polishing plates, together with the objects to be polished, through 180° between the first and second polishing sections; and during an ongoing polishing operation, exchanging the object at the carrier located in the loading and unloading position of the polishing installation in each polishing section.

2. A method for simultaneously polishing a plurality of objects of a similar type, which comprises:

providing a polishing installation with at least two polishing plates disposed diagonally opposite one another with respect to a central axis, and at least four carriers for holding the objects to be polished, a rotary cross connecting the four carriers to one another, the rotary cross being rotatably mounted about the central axis and disposed substantially coaxially with respect to the at least two polishing plates, such that in each position of the polishing installation, in each case one carrier lies opposite a polishing plate and at least one further carrier is located in a loading and unloading position for the object;

dividing each polishing operation into two and only two polishing sections, each of the polishing sections corresponding to approximately half a polishing time;

rotating the two carriers opposite the two polishing plates; together with the objects to be polished, through 180° between the two polishing sections; and during an ongoing polishing operation, exchanging the object at the carrier located in the loading and unloading position of the polishing installation in each polishing section.

3. The method according to claim 1, which comprises, after a polishing operation has ended, rotating one of the two carriers located opposite the two polishing plates, together with the polished objects, into the loading and unloading position for the object.

* * * * *